United States Patent [19]

Ruhland et al.

[11] Patent Number: 5,579,210

[45] Date of Patent: Nov. 26, 1996

[54] APPARATUS AND METHOD FOR COVERING INTERFACE OPENINGS IN A COMPUTER HOUSING

[75] Inventors: Walter Ruhland, Anhausen, Germany; Eric H. M. Lin, Taipei, Taiwan

[73] Assignee: AT&T Global Information Solutions Company, Dayton, Ohio

[21] Appl. No.: 437,105

[22] Filed: May 5, 1995

[51] Int. Cl.[6] .................................................... H05K 9/00
[52] U.S. Cl. ..................... 361/816; 361/800; 361/801; 361/818; 174/35 R; 174/35 GC; 439/607; 439/608
[58] Field of Search .................................. 361/753, 799, 361/800, 801, 816, 818; 174/35 R, 35 GC, 51; 439/607, 608, 609, 59, 61, 947, 92, 95, 88

[56] References Cited

U.S. PATENT DOCUMENTS

| | | | |
|---|---|---|---|
| 3,474,377 | 10/1969 | Carlson et al. | 439/95 |
| 4,629,085 | 12/1986 | Gerhard | 220/1.5 |
| 4,873,395 | 10/1989 | Mast | 174/35 GC |
| 4,901,205 | 2/1990 | Landis et al. | 361/424 |
| 4,971,563 | 11/1990 | Wells, III | 439/61 |
| 4,979,075 | 12/1990 | Murphy | 361/399 |
| 5,004,867 | 4/1991 | Mast | 174/35 GC |
| 5,076,619 | 12/1991 | Chi | 292/17 |
| 5,228,873 | 7/1993 | Hirai | 439/607 |

Primary Examiner—Leo P. Picard
Assistant Examiner—Anthony Dinkins
Attorney, Agent, or Firm—Paul J. Maginot

[57] ABSTRACT

An apparatus for covering an interface opening in a computer housing includes an electromagnetic shielding cover which is positionable over the interface opening, the shielding cover having a first end portion and a second end portion, wherein the first end portion of the shielding cover is positioned within a recess located within the computer housing. The apparatus further includes a clamp maintainable in an operational mode during which the clamp is urged against the second end portion of the shielding cover so as to secure the shielding cover over the interface opening. In addition, the apparatus includes a fastener for maintaining the clamp in the operational mode. A method of covering an interface opening in a computer housing is also disclosed.

18 Claims, 3 Drawing Sheets

APPARATUS AND METHOD FOR COVERING INTERFACE OPENINGS IN A COMPUTER HOUSING

BACKGROUND OF THE INVENTION

The present invention relates generally to computer housings, and more particularly to an apparatus and method for covering interface openings in a computer housing.

A computer housing contains various electronic components. The operation of these components results in the emission of radio frequency (RF) electromagnetic radiation therefrom.

It has been found that any openings in the enclosure surrounding the electronic components enable the escape of RF emissions. Therefore, in order to reduce RF emissions from the computer housings, it is necessary to close and seal any openings therein as best as practicable.

One potential source of escaping RF emissions in computer housings is the interface opening area generally located in the rear panel of a computer housing. An interface opening allows the interconnection of computer enhancing devices (i.e. expansion boards) to peripheral items. An expansion board may be interconnected through the interface opening to other electronic components, such as a keyboard, a printer, or a monitor.

To control RF emissions, it is necessary to cover and seal the area around an interface opening that is being used as well as to cover and seal an interface opening that is not being currently used.

One typical approach to containing RF emissions in computer housings has been to place an interface opening cover over any unused interface openings and to directly secure the cover in place with one or more screws.

However, since the amount of available space within a computer housing is severely limited, it is often impossible for an individual to add or remove an interface opening cover or an expansion board without first removing certain bulky parts from the housing. In desk top computers these bulky parts are typically power supplies and disk drives.

It would be desirable to provide an arrangement which would allow for easy addition and removal of an expansion board in a computer housing.

It would also be desirable to provide an arrangement which would allow for easy addition and removal of an interface opening cover in a computer housing.

It would also be desirable to provide an arrangement which would allow for easy addition and removal of an interface opening cover while ensuring that such cover was securely fastened to the computer housing when mounted over an interface opening.

SUMMARY OF THE INVENTION

In accordance with one embodiment of the present invention, there is provided an apparatus for covering an interface opening in a computer housing. The apparatus includes an electromagnetic shielding cover which is positionable over the interface opening. The apparatus further includes a clamp maintainable in an operational mode during which the clamp is urged against the shielding cover so as to secure the shielding cover over the interface opening. In addition, the apparatus includes a fastener for maintaining the clamp in the operational mode.

Pursuant to another embodiment of the present invention, there is provided a method for covering an interface opening in a computer housing. The method includes the steps of (1) positioning an electromagnetic shielding cover over the interface opening, and (2) clamping the shielding cover in place over the interface opening.

In accordance with yet another embodiment of the present invention, there is provided an apparatus for covering an interface opening in a computer housing. The apparatus includes an electromagnetic shielding cover which is positionable over the interface opening, the shielding cover having a first end portion and a second end portion, wherein the first end portion of the shielding cover is positionable within a recess located within the computer housing. The apparatus further includes a clamp maintainable in an operational mode during which the clamp is urged against the second end portion of the shielding cover so as to secure the shielding cover in place over the interface opening. Moreover, the apparatus includes a fastener for maintaining the clamp in the operational mode.

It is therefore an object of the present invention to provide a new and useful apparatus for covering an interface opening in a computer housing.

It is another object of the present invention to provide a new and useful method for covering an interface opening in a computer housing.

It is a further object of the present invention to provide an improved apparatus for covering an interface opening in a computer housing.

It is moreover an object of the present invention to provide an improved method for covering an interface opening in a computer housing.

It is still another object of the present invention to provide an apparatus and method which would allow for easy addition and removal of an expansion board in a computer housing.

It is moreover another object of the present invention to provide an apparatus and method which would allow for easy addition and removal of an interface opening cover in a computer housing.

It is still another object of the present invention to provide an apparatus and method which would allow for easy addition and removal of an interface opening cover while ensuring that such cover was securely fastened to the computer housing when mounted over an interface opening.

The above and other objects, features, and advantages of the present invention will become apparent from the following description and the attached drawings.

DETAILED DESCRIPTION OF THE PREFERRED EMBODIMENT

Figure 1:
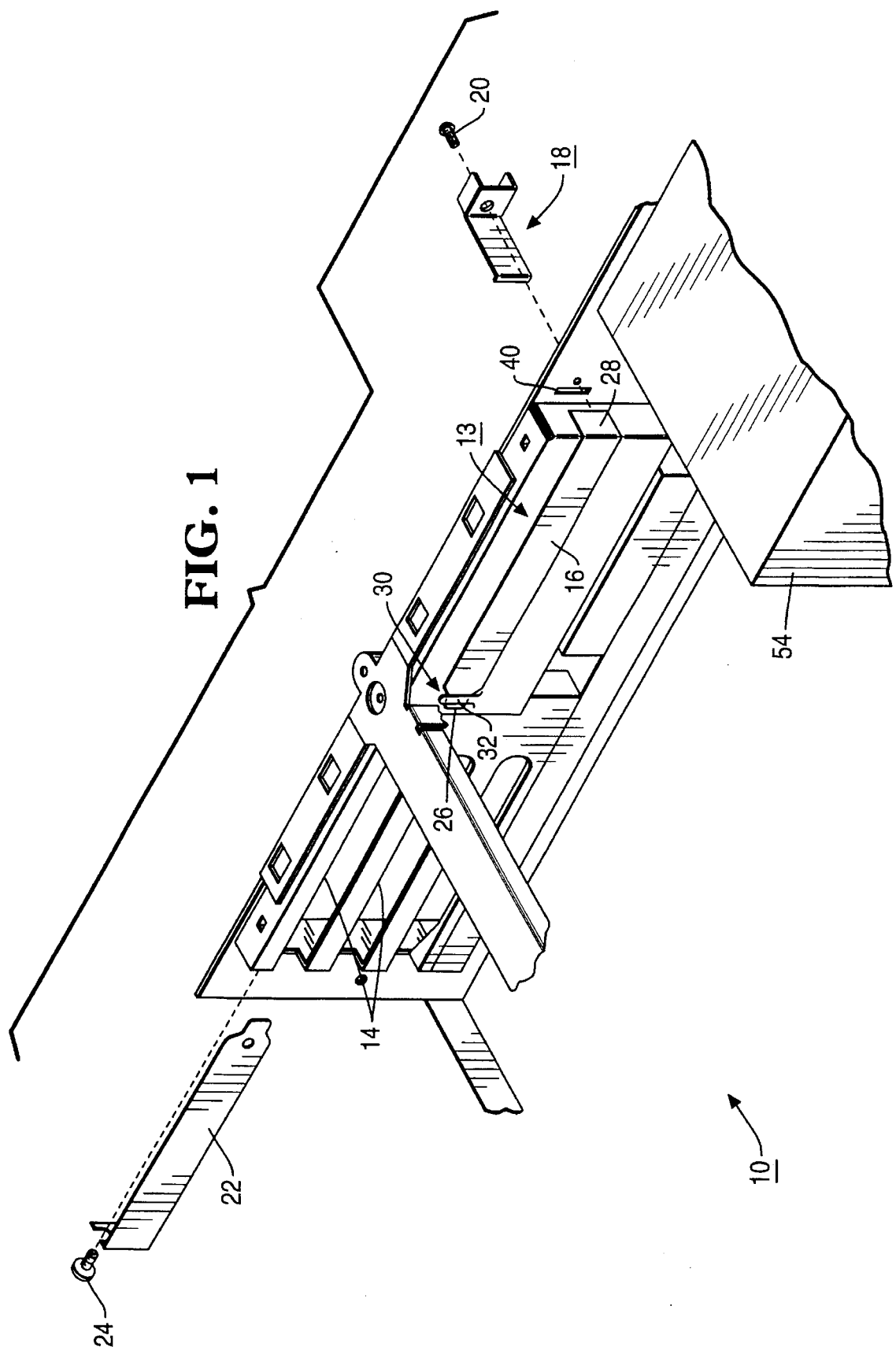
FIG. 1 is a fragmentary perspective view of the interior of a computer housing showing an interface opening cover assembly that incorporates the features of the present invention therein, with many of the internal components of the computer housing not shown for clarity of description.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 2:
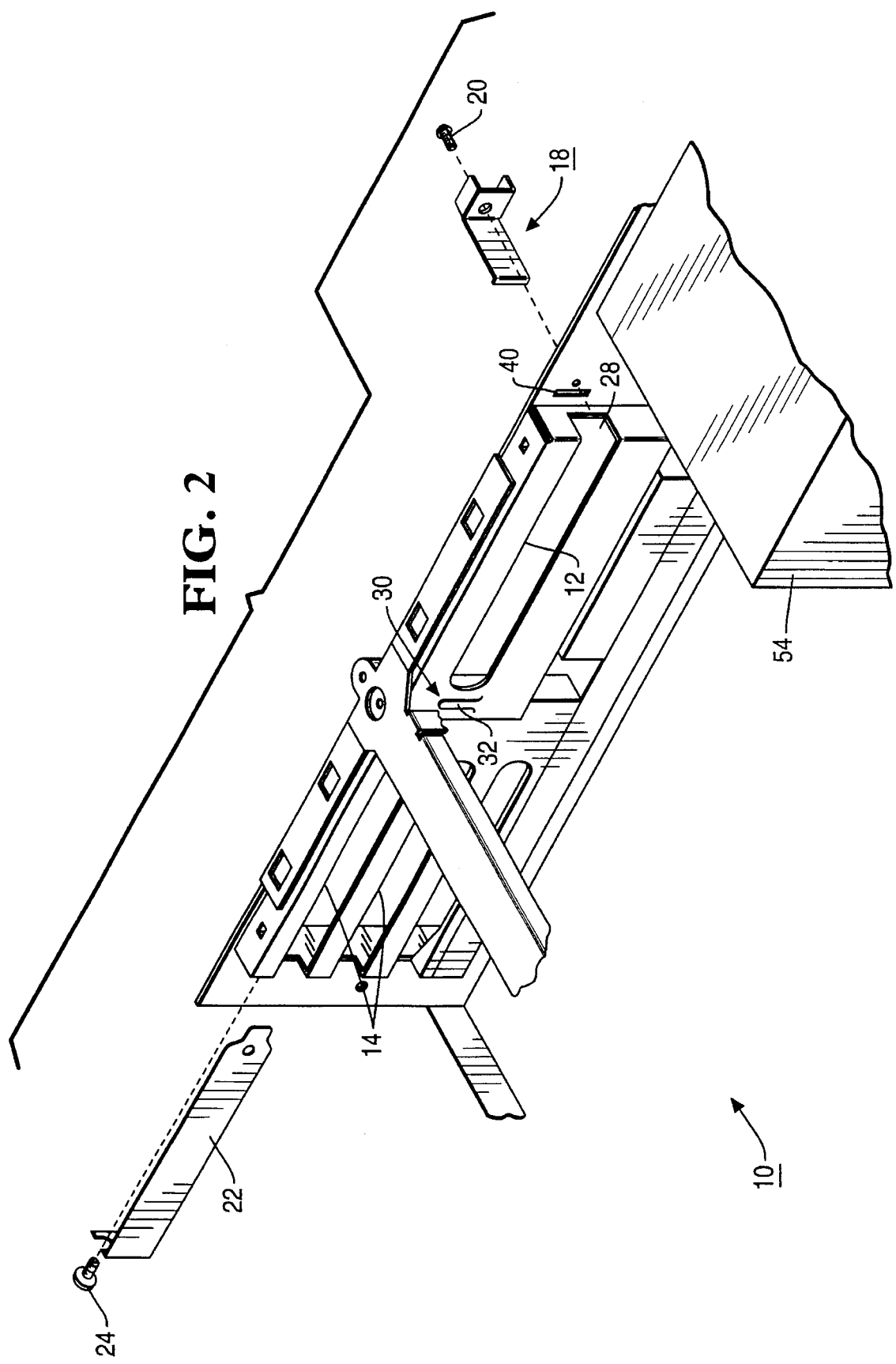
FIG. 2 is a view similar to FIG. 1 but showing the rightmost electromagnetic shielding cover removed for clarity of description.

Referring now to FIGS. 1 and 2, the interior of a computer housing 10 is shown. It should be noted that many of the internal components of the computer housing 10 are not shown in FIGS. 1 and 2 for clarity of description. Additionally, the computer housing 10 is shown with its cover removed in FIGS. 1 and 2.

Defined within the computer housing 10 is a plurality of interface openings 12 and 14. An electromagnetic shielding cover 22 is positionable over the interface opening 14. The shielding cover 22 is secured in place by a screw 24. The screw 24 is able to be readily screwed in place with a screw driver (not shown) when the cover of the computer housing is removed since no internal electrical components such as a power supply obstructs the placement of the screw driver operatively adjacent the screw 24.

An interface opening cover assembly 13 is shown in FIG. 1, and includes an electromagnetic shielding cover 16, a clamp 18 and a fastener 20. The electromagnetic shielding cover 16 is positioned over the interface opening 12 as shown in FIG. 1 (shielding cover 16 is not shown in FIG. 2 for clarity of description). When secured in place, the shielding cover 16 blocks the emission of radio frequency (RF) electromagnetic radiation which would otherwise be emitted through the interface opening 12.

The shielding cover 16 has a first end portion 26 and a second end portion 28 as shown in FIG. 1. The first end portion 26 is positioned within a recess 30 located within the computer housing 10. The recess is defined by a space created by a bracket 32 which is secured to the computer housing 10.

Figure 4:
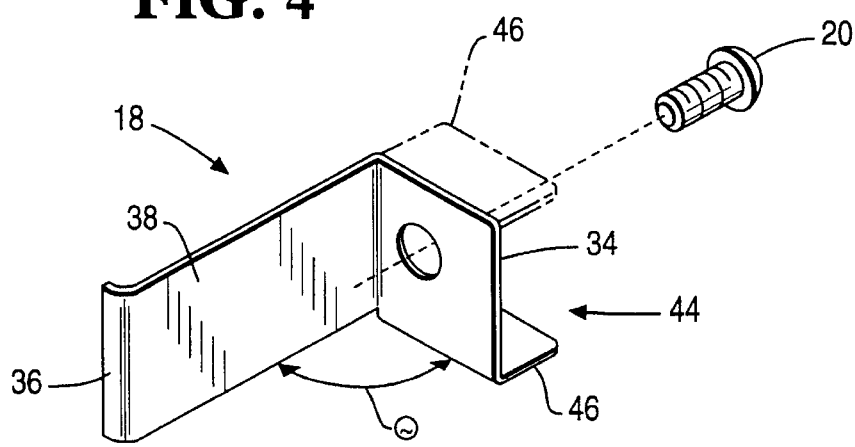
FIG. 4 is an enlarged fragmentary perspective view of the clamp of the interface opening cover assembly of FIG. 1.

The clamp 18 has a first end portion 34, a second end portion 36 and a shank portion 38 as shown in FIG. 4. The clamp 18 is able to urged against the second end portion 28 of the shielding cover 16 in an operational mode so as to secure the shielding cover 16 in place over the interface opening 12.

In order to place clamp 18 in the operational mode, the second end portion 36 is advanced through a slot 40 defined in the computer housing 10. Then, the first end portion 34 of the clamp 18 is secured to an exterior side of the computer housing 10 with the fastener 20 which is preferably a screw.

Figure 3:
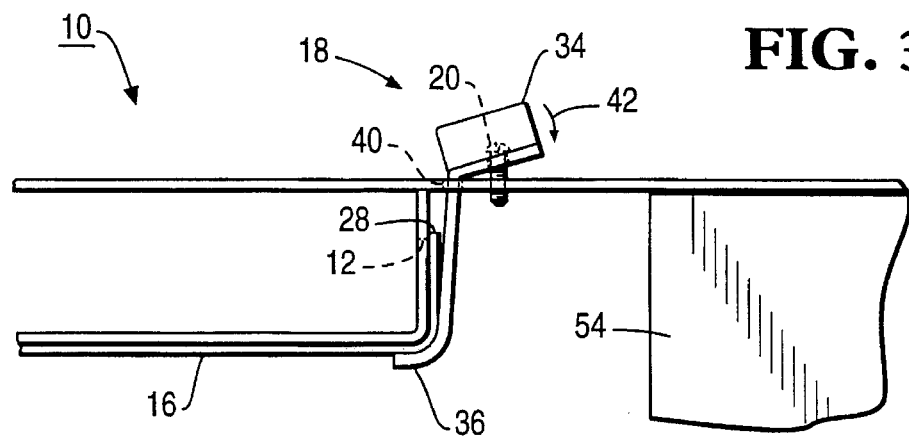
FIG. 3 is an enlarged fragmentary top elevational view of the interface opening cover assembly and computer housing of FIG. 1, with various components not shown for clarity of description.

As the fastener 20 is screwed into the computer housing 10, the first end portion 34 of clamp 18 rotates in the direction of the arrow 42 thereby causing the second end portion 36 of the clamp 18 to be urged against the second end portion 28 of the shielding cover 16 so as to firmly secure the shielding cover 16 over the interface opening 12 (see FIG. 3).

Figure 5:
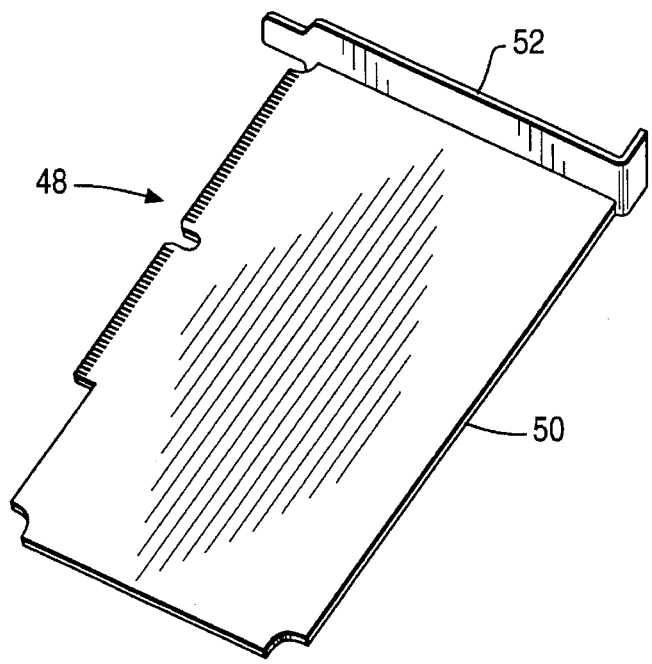
FIG. 5 is a perspective view of an expansion board secured to an electromagnetic shielding cover.

With the fastener 20 readily accessible from the exterior of the computer housing 10, the shielding cover 16 may be easily removed and replaced by an expansion board assembly 48 (see FIG. 5). The expansion board assembly 48 includes an expansion board 50 which is secured to an electromagnetic shielding cover 52. The shielding cover 52 can be readily secured to the computer housing 10 in a manner similar to the securing of the shielding cover 16 as described above.

Referring again to FIG. 3, the clamping action of clamp 18 in its operational mode is achieved by configuring the clamp 18 with an angle $\Theta$ defined by the first end portion 34 and the shank portion 38 (as shown in FIG. 4), wherein the angle $\Theta$ is greater than 90°. Preferably, the angle $\Theta$ is 95°.

The clamp 18 further includes a handle 44 (as shown in FIG. 4) which is useful when the clamp is being fastening to the computer housing with the fastener 20. The handle includes one (or two) projection(s) 46 which are secured to the first end portion 34 of the clamp 18.

The shielding cover 16 or the expansion board assembly 48 can be easily removed or mounted even though an electrical component 54 (e.g. a power supply) is positioned in close proximity to the interface opening 12. This is achievable since the fastener 20 is readily accessible from the exterior of the computer housing 10, and once unscrewed releases clamp 18 from its operational mode. More specifically, once fastener 20 is unscrewed, the second end portion 36 of clamp 18 is no longer urged against the second end portion 28 of shielding cover 16. The fastener 20 is able to be readily unscrewed with a screw driver since no internal electrical components such a power supply obstructs the placement of a screw driver operatively adjacent the fastener 20. Thereafter, an individual may grasp shielding cover 16 and readily remove it from the computer housing 10.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected.

What is claimed is:

1. An apparatus for covering an interface opening in a computer housing, comprising:

an electromagnetic shielding cover which is positionable over the interface opening, said shielding cover having a first end portion and a second end portion, wherein the first end portion of said shielding cover is positionable within a recess located within the computer housing;

a clamp maintainable in an operational mode during which said clamp is urged against the second end portion of said shielding cover so as to secure said shielding cover in place over the interface opening; and a fastener for maintaining said clamp in the operational mode.

2. The apparatus of claim 1, wherein the computer housing includes a wall in which the interface opening is defined, and further wherein said clamp is securable to the wall with said fastener.

3. The apparatus of claim 2, wherein said clamp comprises a first end portion and a second end portion, and further wherein when said clamp is maintained in the operational mode:

the first end portion of said clamp is secured to the wall; and the second end portion of said clamp is urged against said shielding cover.

4. The apparatus of claim 3, wherein the wall includes an exterior side, and further wherein the first end portion of said clamp is secured to the exterior side of the wall.

5. The apparatus of claim 4, wherein said clamp includes a shank portion which is interposed between the first end portion of said clamp and the second end portion of said clamp, and further wherein said shank portion extends through a slot defined in the wall.

6. The apparatus of claim 3, wherein said clamp further includes a handle which is secured to the first end portion of said clamp.

7. The apparatus of claim 6, wherein said handle includes a pair of projections which are secured to the first end portion of said clamp.

8. The apparatus of claim 1, wherein said shielding cover is secured to an expansion board.

9. An apparatus for covering an interface opening in a computer housing, comprising:

an electromagnetic shielding cover which is positionable over the interface opening;

a clamp maintainable in an operational mode during which said clamp is urged against said shielding cover so as to secure said shielding cover over the interface opening; and a fastener for maintaining said clamp in the operational mode.

10. The apparatus of claim 9, wherein the computer housing includes a wall in which the interface opening is defined, and further wherein said clamp is securable to the wall with said fastener.

11. The apparatus of claim 10, wherein said clamp comprises a first end portion and a second end portion, and further wherein when said clamp is maintained in the operational mode:

the first end portion of said clamp is secured to the wall; and the second end portion of said clamp is urged against said shielding cover.

12. The apparatus of claim 11, wherein the wall includes an exterior side, and further wherein the first end portion of said clamp is secured to the exterior side of the wall.

13. The apparatus of claim 12, wherein said clamp includes a shank portion which is interposed between the first end portion of said clamp and the second end portion of said clamp, and further wherein said shank portion extends through a slot defined in the wall.

14. The apparatus of claim 11, wherein said clamp further includes a handle which is secured to the first end portion of said clamp.

15. The apparatus of claim 14, wherein said handle includes a pair of projections which are secured to the first end portion of said clamp.

16. The apparatus of claim 9, wherein said shielding cover is secured to an expansion board.

17. A method for covering an interface opening in a computer housing, comprising the steps of:

positioning an electromagnetic shielding cover over the interface opening; and clamping the shielding cover in place over the interface opening by securing a clamp to the computer housing with a fastener.

18. The method of claim 17, wherein the clamp includes a first end portion and a second end portion, and wherein said securing step comprises the steps of:

advancing the second end portion of said clamp through a slot defined in the computer housing;

securing the first end portion of said clamp to the computer housing so as to urge the second end portion of said clamp against the shielding cover.

* * * * *